(12) United States Patent
Thyssen

(10) Patent No.: US 10,165,361 B2
(45) Date of Patent: Dec. 25, 2018

(54) SYSTEM AND METHOD FOR LOUDSPEAKER PROTECTION

(71) Applicant: Avago Technologies International Sales Pte. Limited

(72) Inventor: Jes Thyssen, San Juan Capistrano, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/365,336

(22) Filed: Nov. 30, 2016

(65) Prior Publication Data

US 2017/0347188 A1 Nov. 30, 2017

Related U.S. Application Data

(60) Provisional application No. 62/343,517, filed on May 31, 2016, provisional application No. 62/415,026, (Continued)

(51) Int. Cl.
*H03G 11/00* (2006.01)
*H04R 3/00* (2006.01)
(Continued)

(52) U.S. Cl.
CPC .......... *H04R 3/007* (2013.01); *G10L 21/0232* (2013.01); *H03G 3/3005* (2013.01);
(Continued)

(58) Field of Classification Search
CPC .................................................... H03G 11/00
See application file for complete search history.

(56) References Cited

U.S. PATENT DOCUMENTS 9,065,412 B2   6/2015  Wu
9,800,734 B2  10/2017  Kechichian et al.
(Continued)

OTHER PUBLICATIONS

Bright, A., *Active Control of Loudspeakers: An Investigation of Practical Applications*, Ph.D. Thesis, Ørsted•DTU—Acoustic Technology, Technical University of Denmark, 2002, 203 pages.
(Continued)

*Primary Examiner* — Olisa Anwah
(74) *Attorney, Agent, or Firm* — Sterne, Kessler, Goldstein & Fox P.L.L.C.

(57) ABSTRACT

Systems, devices, and methods are described for providing loudspeaker protection. An upstream loudspeaker model estimation component receives sensed electrical characteristics of a loudspeaker, estimates the impedance of the loudspeaker, fits an impedance model to the estimated impedance, and generates an excursion model of the loudspeaker and a gain change parameter from the estimated parameters of the impedance model. A downstream audio signal processing component utilizes the gain change parameter and the excursion model, or parameters thereof, to constrain the temperature of a voice coil of the loudspeaker and to limit a predicted excursion of the loudspeaker. The downstream audio signal processing component also utilizes processed signals associated with the constrained temperature and the limited excursion to suppress unwanted distortion for an output audio signal to be played back by the loudspeaker.

18 Claims, 5 Drawing Sheets

Related U.S. Application Data filed on Oct. 31, 2016, provisional application No. 62/423,292, filed on Nov. 17, 2016, provisional application No. 62/423,533, filed on Nov. 17, 2016.

(51) Int. Cl.

| | | |
|---|---|---|
| *G10L 21/0232* | (2013.01) | |
| *H04R 29/00* | (2006.01) | |
| *H03G 3/30* | (2006.01) | |
| *H04R 3/04* | (2006.01) | |
| *H04R 9/06* | (2006.01) | |

(52) U.S. Cl.
CPC .............. *H04R 3/04* (2013.01); *H04R 29/001* (2013.01); *H04R 29/003* (2013.01); *H04R 9/06* (2013.01); *H04R 2499/11* (2013.01)

(56) References Cited

U.S. PATENT DOCUMENTS

| | | | |
|---|---|---|---|
| 9,837,971 | B2 | 12/2017 | Luo et al. |
| 2005/0175196 | A1 | 8/2005 | Chen |
| 2010/0215193 | A1* | 8/2010 | Wihardja ............... H03G 5/005 381/103 |
| 2011/0178800 | A1 | 7/2011 | Watts |
| 2011/0228945 | A1* | 9/2011 | Mihelich ................ H04R 3/002 381/59 |
| 2012/0281844 | A1 | 11/2012 | Luo et al. |
| 2015/0003606 | A1 | 1/2015 | Nemer |
| 2015/0304772 | A1 | 10/2015 | Risberg et al. |
| 2015/0304775 | A1* | 10/2015 | Fujita ....................... H04R 3/04 381/94.2 |
| 2016/0192070 | A1 | 6/2016 | Bjoern-Josefsen et al. |
| 2016/0241960 | A1 | 8/2016 | Cheng et al. |
| 2017/0318388 | A1 | 11/2017 | Risberg et al. |
| 2017/0318390 | A1 | 11/2017 | Bjork et al. |
| 2017/0345438 | A1 | 11/2017 | Thyssen |
| 2017/0347189 | A1 | 11/2017 | Thyssen |
| 2017/0347190 | A1 | 11/2017 | Thyssen |
| 2017/0347199 | A1 | 11/2017 | Mao et al. |

OTHER PUBLICATIONS

Bright, A., "Discrete-time loudspeaker modelling," *Audio Engineering Society 114th Convention*, Amsterdam, The Netherlands, Mar. 22-25, 2003, 25 pages.

Henderson, H.V. and Searle, S.R., "On Deriving the Inverse of a Sum of Matrices," *Paper No. BU-647-M in the Biometrics Unit Series*, Jan. 1980, 21 pages.

Johnson, C.R., Jr., "Adaptive IIR filtering: Current Results and Open Issues," *IEEE Transactions on Information Theory*, vol. IT-30, No. 2, Mar. 1984, pp. 237-250.

Klippel, W., "Assessment of Voice-Coil Peak Displacement Xmax," *Journal of Audio Engineering Society*, vol. 51, No. 5, May 2003, 15 pages.

Klippel, W. and Seidel, U., "Fast and Accurate Measurement of Linear Transducer Parameters," *Audio Engineering Society 110th Convention*, Amsterdam, The Netherlands, May 12-15, 2001, 8 pages.

Klippel, W., "Large Signal Performance of Tweeters, Micro Speakers, and Horn Drivers," *Audio Engineering Society 118th Convention*, May 2005, 18 Pages.

Klippel, W., "Measurement of Large-Signal Parameters of Electrodynamic Transducer", *Audio Engineering Society 107th Convention*, New York, Sep. 24-27, 1999, 22 Pages.

Klippel, W., "Nonlinear losses in electro-acoustical transducers," *Proceedings of the Acoustics 2012 Nantes Conference*, Nantes, France, Apr. 23-27, 2012, pp. 3483-3488.

Klippel, W. et al., "The power of Loudspeaker Models," Workshop at Audio Engineering Society 117th Convention, San Francisco, Oct. 28-31, 2004, 50 Pages.

Klippel, W., "Tutorial: Loudspeaker Nonlinearities—Causes, Parameters, Symptoms," *Journal of the Audio Engineering Society*, vol. 54, No. 10, Oct. 2006, pp. 907-939.

Knudsen, M.H. et al., "Determination of Loudspeaker Driver Parameters Using a System Identification Technique," *Journal of the Audio Engineering Society*, vol. 37, No. 9, Sep. 1989, pp. 700-708.

Luo, C. et al., "A Model Based Excursion Protection Algorithm for Loudspeakers," *Proceedings ICASSP*, 2012, pp. 233-236.

Shynk, J.J., "Adaptive IIR Filtering", *IEEE ASSP Magazine*, Apr. 1989, pp. 4-21.

* cited by examiner

SYSTEM AND METHOD FOR LOUDSPEAKER PROTECTION

CROSS-REFERENCE TO RELATED APPLICATIONS

The instant application claims priority to each of: U.S. Provisional Patent Application No. 62/343,517, entitled "System and Method for Loudspeaker Protection," filed on May 31, 2016, U.S. Provisional Patent Application No. 62/415,026, entitled "System and Method for Loudspeaker Protection," filed on Oct. 31, 2016, U.S. Provisional Patent Application No. 62/423,292, entitled "System and Method for Loudspeaker Protection," filed on Nov. 17, 2016, and U.S. Provisional Patent Application No. 62/423,533, entitled "System and Method for Loudspeaker Protection," filed on Nov. 17, 2016, the entirety of each of which is incorporated herein by reference.

BACKGROUND

I. Technical Field

Embodiments described herein relate to protection of loudspeakers during operation.

II. Background Art

Devices, such as personal computers and laptops, cellular and smart phones, wireless device accessories, headsets, personal digital assistants (PDAs), portable music players, handheld gaming devices, home electronics and entertainment devices, televisions, stand-alone loudspeaker units, etc., include loudspeakers, such as microspeakers, for reproduction or playback of an audio signal. Loudspeakers may suffer damage and/or failures from extended high-stress use and over-excursion scenarios. For example, extended use at high audio volume levels can cause breakdowns by melting the adhesives used to attach the voice coils in loudspeakers. High audio volume levels can also cause diaphragms of loudspeakers to travel (i.e., undergo an excursion) beyond their mechanical capabilities resulting in permanent damage to the suspension of the loudspeaker. Existing solutions use linear filtering to constrain the amplitude of audio signals to mediate excursions based on a loudspeaker model. This constraint processing may introduce distortion into audio signals or excessively lower the perceived loudness of the audio signal.

BRIEF SUMMARY

Methods, systems, and apparatuses are described for loudspeaker protection, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

I. Introduction

Figure 1A:
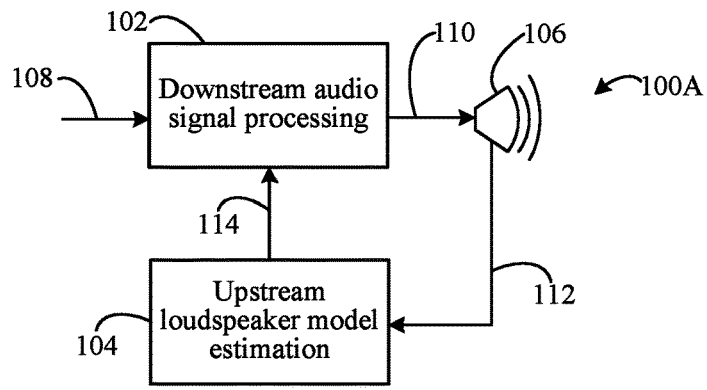
FIG. 1A shows a block diagram of a loudspeaker protection system, according to an example embodiment.

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In the discussion, unless otherwise stated, adjectives such as "substantially," "approximately," and "about" modifying a condition or relationship characteristic of a feature or features of an embodiment of the disclosure, are understood to mean that the condition or characteristic is defined to be within tolerances that are acceptable for operation of the embodiment for an application for which it is intended.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Still further, it should be noted that the drawings/figures are not drawn to scale unless otherwise noted herein.

Numerous exemplary embodiments are now described. Any section/subsection headings provided herein are not intended to be limiting. Embodiments are described throughout this document, and any type of embodiment may be included under any section/subsection. Furthermore, it is contemplated that the disclosed embodiments may be combined with each other in any manner. That is, the embodiments described herein are not mutually exclusive of each other and may be practiced and/or implemented alone, or in any combination.

II. Example Embodiments

The example techniques and embodiments described herein may be adapted to various types of systems and devices, for example but without limitation, personal computers and laptops, communication devices (e.g., cellular and smart phones), wireless device accessories, headsets, personal digital assistants (PDAs), portable music players, handheld gaming devices and gaming consoles, televisions, stand-alone loudspeaker units, and/or the like, that include loudspeakers, such as but not limited to microspeakers. While the embodiments herein may be described with respect to microspeakers as conceptual and/or illustrative examples for descriptive consistency, other types of loudspeakers are also contemplated for implementing the disclosed techniques. It is contemplated herein that in various embodiments and with respect to the illustrated figures of this disclosure, one or more components described and/or shown may not be included and that additional components may be included.

The techniques described herein provide novel loudspeaker protection systems, methods, and devices, such as in devices with loudspeakers, e.g., microspeakers, etc. The described techniques and embodiments provide for efficient, robust loudspeaker protection using upstream loudspeaker model estimation and downstream audio signal processing. For example, a loudspeaker protection system may include an upstream loudspeaker model estimation component and a downstream audio signal processing component.

An upstream loudspeaker model estimation component of an audio protection system according to embodiments is configured to provide component-based impedance model fitting of electrical characteristics of operating loudspeakers. That is, current and/or voltage characteristics of an operating loudspeaker may be sensed (e.g., during playback of general audio) to generate an impedance estimation. From this estimation, different impedance components, which comprise one or more respective impedance parameters, may be individually fit into an impedance model. Furthermore, some loudspeaker enclosures result in a secondary resonance which can also be reliably fit into the impedance model. In embodiments, separate excursion model conversion (to model excursions of operating loudspeakers) is provided by upstream loudspeaker model estimation components based on the impedance model. The described upstream loudspeaker model estimation components also seamlessly incorporate temperature prediction and corresponding gain modifiers into the loudspeaker protection systems herein.

A downstream audio signal processing component of an audio protection system according to embodiments is configured to utilize the gain modifiers generated by the upstream loudspeaker model estimation component to process an audio signal, e.g., reducing gain, to lower voice coil temperature to within acceptable operational ranges. A downstream audio signal processing component is also configured to perform signal processing to constrain loudspeaker excursion. The signal processing operates to constrain or limit a diaphragm excursion (e.g., a predicted excursion) of a loudspeaker by processing the corresponding audio signals such that the resulting excursion is constrained using a non-linear constraint filter, which includes a limiter, in a manner that is based on the excursion model. Limiting the excursion of the diaphragm of the loudspeaker mitigates, or eliminates, loudspeaker damage or failure due to the loudspeaker diaphragm traveling beyond its mechanical limits. Techniques also provide for distortion suppression to suppress unwanted distortion introduced by the non-linear constraint filter on a frequency bin basis. An unwanted distortion may be one that creates an objectionable listening experience for a listener or user of the device. In embodiments, unwanted distortion may be based on one or more types of distortion meeting or exceeding a threshold. While diaphragm excursions are referred to herein, it is also contemplated that other excursions associated with loudspeakers, e.g., cone excursions, are contemplated herein, and the described techniques and embodiments are applicable thereto.

FIG. 1A shows a block diagram of a loudspeaker protection system 100A, according to an embodiment. Loudspeaker protection system 100A includes a downstream audio signal processing component 102 and an upstream loudspeaker model estimation component 104. Downstream audio signal processing component 102 and upstream loudspeaker model estimation component 104 may perform functions as described above. Upstream loudspeaker model estimation component 104 is configured to receive sensed electrical characteristics, or indicia thereof, of a loudspeaker 106 via a connector 112 when loudspeaker 106 is operating, i.e., reproducing audio sounds. Upstream loudspeaker model estimation component 104 is configured to generate an excursion model and a gain modifier for providing to downstream audio signal processing component 102 via a connector 114. Downstream audio signal processing component 102 is configured to receive an audio signal via a connector 108 and perform audio signal processing according to the excursion model and/or gain modifier, in embodiments, and is configured to perform distortion suppression of audio signals, in embodiments, for audio signal outputs provided for playback by loudspeaker 106 via a connector 110.

In embodiments, upstream loudspeaker model estimation component 104 does not perform processing of audio signals, while downstream audio signal processing component 102 performs all audio signal processing. Additionally, upstream loudspeaker model estimation component 104 is configured to update and provide the excursion model and the gain modifier to downstream audio signal processing component 102 asynchronously with respect to the operation of downstream audio signal processing component 102, e.g. the downstream processing component 102 may be block based, for instance, with a 10 ms frame, i.e., a frame-rate of 1 frame per 10 ms, while the upstream component 104 provides parameters to the downstream processing component less frequently or at a slower rate, but typically on a downstream frame boundary. Upstream loudspeaker model estimation component 104 and downstream audio signal processing component 102 may be implemented in hardware, firmware, software, or any combination thereof. In one embodiment, downstream audio signal processing component 102 is implemented as electrical hardware and upstream loudspeaker model estimation component 104 is implemented as a combination of hardware, firmware, and software.

As noted above, loudspeaker protection system 100A may be adapted to various types of systems and devices, for example but without limitation, personal computers and laptops, communication devices (e.g., cellular and smart phones), wireless device accessories, headsets, personal digital assistants (PDAs), portable music players, handheld gaming devices and gaming consoles, televisions, stand-alone loudspeaker units, and/or the like, that include loudspeakers. It should be understood that the connections described above may comprise one or more connections that are related to or separate from each other. Further embodiments and details relating to loudspeaker protection systems, downstream audio signal processing component 102, and upstream loudspeaker model estimation component 104 are described elsewhere herein.

Figure 1B:
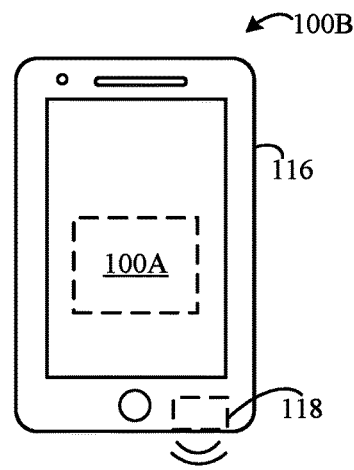
FIG. 1B shows a device that includes the loudspeaker protection system of FIG. 1A, according to an example embodiment.

FIG. 1B shows a device 100B that includes loudspeaker protection system 100A of FIG. 1A, according to an embodiment. While device 100B is shown as a smartphone, other types of devices described herein are also contemplated according to embodiments. Device 100B includes a base structure 116. Base structure 116 includes buttons and/or other types of user interfaces, cameras, and microphones, as well as processing and communication circuitry, memory, and/or the like, commonly found in smartphones as would be understood by one of skill in the relevant art(s) having the benefit of this disclosure. Base structure 116 may also include an enclosure 118 having an aperture through which sound of a loudspeaker (e.g., loudspeaker 106 of FIG. 1A) is emitted. Enclosure 118 may encompass or substantially encompass the loudspeaker, and may result in a secondary resonance during operation of the loudspeaker.

Referring back to FIG. 1A, loudspeaker 106 may be any type of loudspeaker, such as a microspeaker (a thin electrodynamic loudspeaker), and more than loudspeaker may be included in a device, according to embodiments. In such embodiments, the embodiments and techniques described herein may be applied to one or more loudspeakers of a device.

Figure 1C:
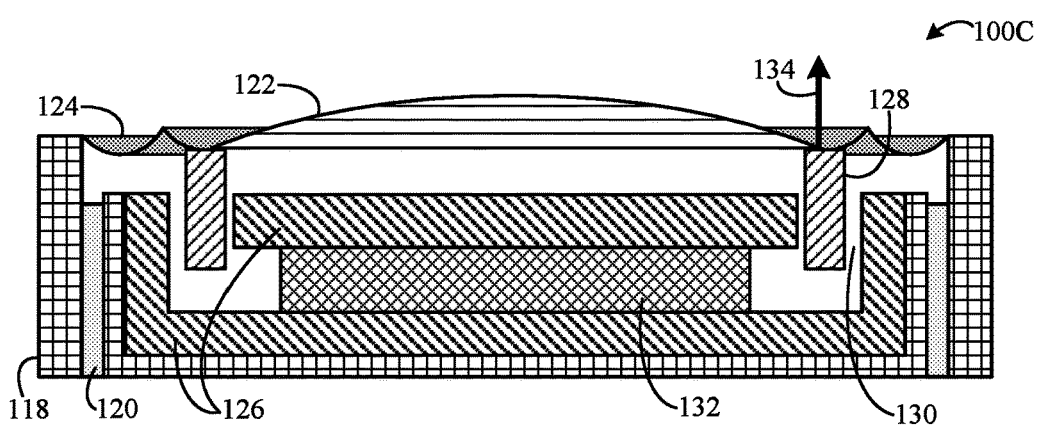
FIG. 1C shows diagram of a cross-section of a microspeaker, according to an example embodiment.

Turning now to FIG. 1C, a diagram of a cross-section of a microspeaker 100C is shown, according to an embodiment. Microspeaker 100C may be a further embodiment of loudspeaker 106 of FIG. 1A, and may be included in enclosure 118 of FIG. 1B in embodiments. Microspeaker 100C includes a frame 118 having one or more ventilation passages 120. Frame 118 supports magnetic circuits 126 and a suspension 124, and a magnet 132 is included between magnetic circuits 126, e.g., as shown in FIG. 1C. A voice coil 128 is attached via adhesive to a diaphragm 122. A magnetic field is applied in a gap 130 between voice coil 128 and magnetic circuits 126 resulting in voice coil 128 exerting a force $f_x$ on diaphragm 122 causing diaphragm 122 to travel a distance $x_d$ (i.e., an excursion or displacement). The force $f_x$ and the distance $x_d$ are denoted as a vector 134. The magnitude of $f_x$ and length of $x_d$ correlate to the magnetic field and its associated voltage of an audio signal being played back by microspeaker 100C. If excessive force is applied as $f_x$, or applied for an extended period of time, diaphragm 122 of microspeaker 100C may travel beyond its mechanical limits (i.e., an excursion with a distance $x_d$) resulting in damage or failure of microspeaker 100C. Furthermore, adhesives used to attach voice coil 128 to diaphragm 122 and/or suspension 124 may slowly breakdown or melt with rising temperatures of voice coil 128. Accordingly, the techniques and embodiments described herein provide for improvements in the protection of loudspeakers as described above, including but not limited to microspeakers.

For instance, methods, systems, devices, and apparatuses are provided for improved loudspeaker protection. A loudspeaker protection system in accordance with an example aspect is described. The loudspeaker protection system includes an upstream loudspeaker model estimation component and a downstream audio signal processing component. The upstream loudspeaker model estimation component includes an impedance model fitter configured to receive at least current data from a loudspeaker and to estimate impedance model parameters of the loudspeaker based on at least the current sensor data, and an excursion model converter configured to convert the impedance model parameters to parameters of the an excursion model of the loudspeaker. The downstream audio signal processing component includes first audio signal processing circuitry configured to receive an audio signal and receive the parameters of the excursion model of the loudspeaker from the upstream loudspeaker model estimation component and to generate a processed version of the audio signal corresponding to a constrained predicted excursion based on the excursion model resulting in a constrained excursion when played back on the loudspeaker, and distortion suppression circuitry configured to suppress unwanted distortion in the processed version of the audio signal, thereby generating an output audio signal for playback by the loudspeaker.

A method in a loudspeaker protection system in accordance with another example aspect is described. The method includes generating an excursion model of a loudspeaker based on converting an impedance model of the loudspeaker, during operation thereof, to the excursion model by an upstream loudspeaker model estimation component, and providing the excursion model to a first audio signal processing component of a downstream audio signal processing component. The method also includes receiving an audio signal by the first audio signal processing component, and limiting an excursion of the loudspeaker based on the excursion model by the first audio signal processing component by generating a processed version of the audio signal corresponding to a constrained excursion. The method further includes suppressing distortion of the processed version of the audio signal by a distortion suppression component of the downstream audio signal processing component, thereby generating an output audio signal, and providing the output audio signal for playback by the loudspeaker.

A computer readable storage device in accordance with yet another example aspect is also described. The computer readable storage device comprises a storage medium encoded with program instructions that, when executed by a computing device, cause the computing device to perform a method for loudspeaker protection based on processing of an audio signal. The program instructions include impedance model fitting program instructions for receiving one or more sensed indicia of electrical characteristics of operational performance of a loudspeaker, and generating an impedance model of the loudspeaker based on the received one or more sensed indicia. The program instructions also include voice coil temperature prediction program instructions for receiving a resistivity portion of the impedance model, predicting a temperature of a voice coil of the loudspeaker based on the impedance model, and determining a gain change parameter based on the predicted temperature and providing the gain change parameter to temperature-constraining processing circuitry configured to constrain the temperature of the voice coil by adjusting a gain applied to the audio signal, thereby generating a temperature-constrained audio signal. The program instructions further include excursion model program instructions for receiving the impedance model, converting the impedance model to an excursion model of the loudspeaker, and providing the excursion model to excursion-constraining processing circuitry configured to constrain an excursion of the loudspeaker by limiting the temperature-constrained audio signal based on the excursion model.

Various example embodiments are described in the following subsections. In particular, example upstream loudspeaker model estimation embodiments are described. This description is followed by downstream audio signal processing embodiments. Next, further example embodiments and advantages are described, and subsequently an example computing device implementation is described. Finally, some concluding remarks are provided. It is noted that the division of the following description generally into subsections is provided for ease of illustration, and it is to be understood that any type of embodiment may be described in any subsection.

III. Example Upstream Loudspeaker Model Estimation Embodiments

As noted above, systems for protection of loudspeakers, such as microspeakers, along with their components such as upstream loudspeaker model estimation components, may be configured in various ways to provide loudspeaker protection.

In embodiments, by way of illustrative example and not limitation, an upstream loudspeaker model estimation component comprises one or more subcomponents configured to estimate parameters of an impedance model of a loudspeaker during operation by fitting the impedance model to a measured impedance (from one or more of sensed voice coil current and voltage sense signals), generate an excursion model, predict a temperature of a voice coil of the loudspeaker, and generate a gain change parameter. These functions of the upstream loudspeaker model estimation component may be based, at least in part, on sensed electrical characteristics, or indicia thereof, of the loudspeaker during its operation.

Figure 2:
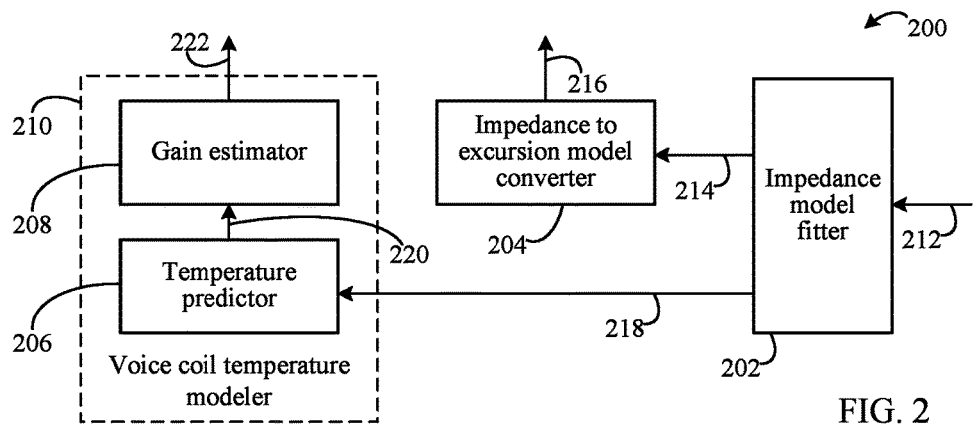
FIG. 2 shows a block diagram of an upstream loudspeaker model estimation component of a loudspeaker protection system, according to an example embodiment.

FIG. 2 shows a block diagram of an upstream loudspeaker model estimation component 200 of a loudspeaker protection system, according to an embodiment. Upstream loudspeaker model estimation component 200 may be a further embodiment of upstream loudspeaker model estimation component 104 of FIG. 1A. Upstream loudspeaker model estimation component 200 includes an impedance model fitter 202, an impedance to excursion model converter 204, a temperature predictor 206, and a gain estimator 208. In embodiments, temperature predictor 206 and gain estimator 208 may together comprise a voice coil temperature modeler 210.

Figure 3:
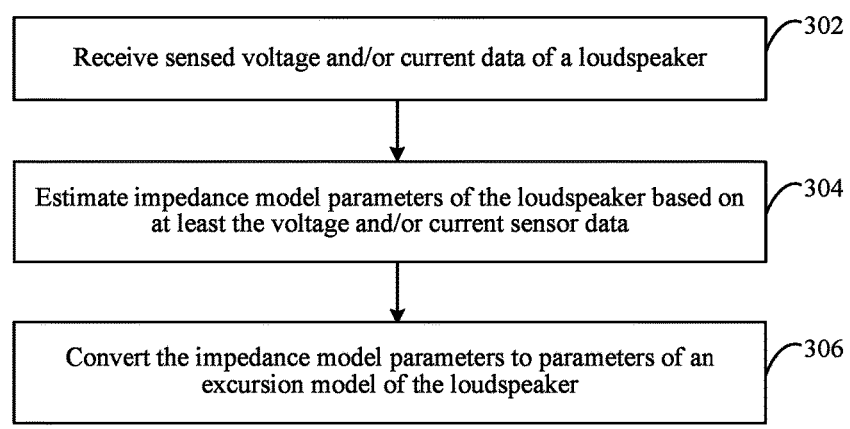
FIG. 3 shows a flowchart for model generation by the upstream loudspeaker model estimation component of FIG. 2, according to an example embodiment.

Referring also to FIG. 3, a flowchart 300 for model generation by upstream loudspeaker model estimation component 200 of FIG. 2 is shown, according to an embodiment. Upstream loudspeaker model estimation component 200, along with its subcomponents such as impedance model fitter 202 and impedance to excursion model converter 204, may be configured to perform their respective functions in accordance with flowchart 300. Flowchart 300 is described as follows.

Voltage and/or current sensor data of a loudspeaker are received (302). For example, impedance model fitter 202 is configured to receive voltage and current sensor data for a loudspeaker and/or a voice coil thereof, such as loudspeaker 106 of FIG. 1A, via a connector 212 from a voltage sensor and a current sensor (not shown) electrically coupled to the loudspeaker. The received voltage sense data and current sense data are operational data sensed during operation of the loudspeaker, e.g., during playback of audio, according to embodiments, and may be sensed voltage and current data of a voice coil of the loudspeaker, e.g., as illustrated in FIG. 1C. In embodiments, indicia of the voltage sense data and current sense data may be received. In some embodiments where only sensed current data is received, voltage data may be estimated by impedance model fitter 202, e.g., based on characteristics of a power amplifier that drives the loudspeaker.

Impedance model parameters of the loudspeaker are estimated based on the voltage and/or current sensor data (304). For instance, impedance model fitter 202 is configured to estimate the impedance model parameters of the loudspeaker based on one or more of the voltage and current sensor data. That is, based on the received sensor data, or indicia, an impedance estimate may be generated, e.g., according to impedance 'Z' being equal to voltage 'U' divided by current 'I' (as function of frequency):

$$U(s)=I(s)Z(s), \quad \text{(Eq. 1)}$$

solving for Z, $$|Z(s)| = \frac{|U(s)|}{|I(s)|}. \quad \text{(Eq. 2)}$$

The impedance model may include one or more components (or impedance components) such as resistivity, inductance, primary resonance, and secondary resonance. The parameters of the components may be estimated in embodiments by fitting the impedance model to the impedance estimate (e.g., the observed impedance of the loudspeaker that may be calculated from the sensed voltage and current during general audio playback).

The impedance model parameters are converted to parameters of an excursion model of the loudspeaker (306). For instance, impedance to excursion model converter 204 is configured to convert the impedance model parameters to parameters of an excursion model of the loudspeaker. Impedance to excursion model converter 204 is configured to receive the impedance model and/or its parameters from impedance model fitter 202, via a connector 214, and to generate the excursion model parameters based on the conversion of one or more components of the impedance model, and a force factor 'φ' of the loudspeaker that may be provided by a manufacturer or derived from operation of the loudspeaker. In embodiments, the excursion model may be generated by conversion with or without taking the secondary resonance and/or the inductance components into account. In embodiments, excursion model converter 204 and/or impedance model fitter 202 are configured to automatically adapt the excursion model to include or exclude impedance components based on at least the estimated impedance that corresponds to the estimated impedance model parameters. For example, if an impedance component is estimated to be negligible, excursion model converter 204 and/or impedance model fitter 202 are configured to automatically adapt the excursion model to exclude that impedance component. Likewise, if the impedance component later becomes non-negligible, excursion model converter 204 and/or impedance model fitter 202 are configured to automatically adapt the excursion model to include the impedance component.

The excursion model and/or its parameters generated by conversion at impedance to excursion model converter 204 may be provided via a connector 216 to downstream processing circuitry or a downstream processing component, such as in downstream audio signal processing component 102 of FIG. 1A, for use in the processing of audio signals, as described further herein.

Figure 4:
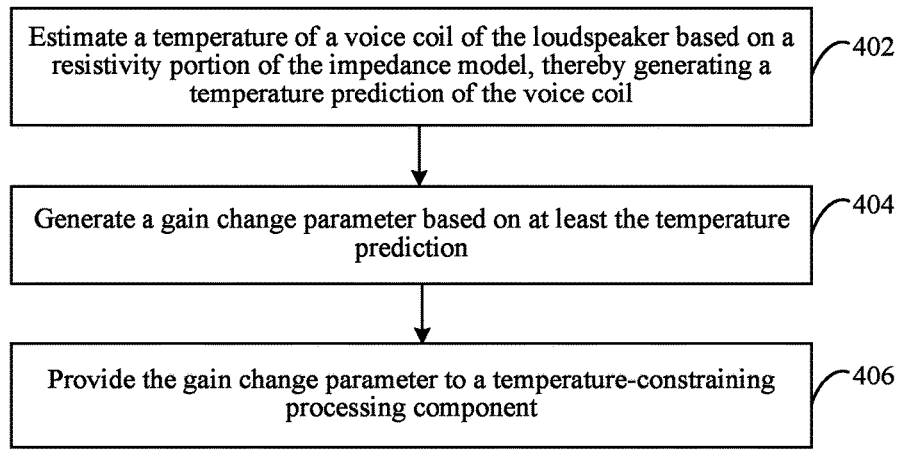
FIG. 4 shows a flowchart for temperature prediction and gain change by the upstream loudspeaker model estimation component of FIG. 2, according to an example embodiment.

FIG. 4 shows a flowchart 400 for temperature prediction and gain change by upstream loudspeaker model estimation component 200 of FIG. 2, according to an embodiment. Upstream loudspeaker model estimation component 200, along with its subcomponents such as temperature predictor 206 and gain estimator 208, may be configured to perform their respective functions in accordance with flowchart 400. Flowchart 400 is described as follows.

A temperature of a voice coil of the loudspeaker is estimated based on a resistivity portion of the impedance model, thereby generating a temperature prediction of the voice coil (402). For example, temperature predictor 206 is configured to receive a resistivity portion of the impedance model, as described above, via a connector 218, and to estimate or predict the temperature of the voice coil of the loudspeaker based thereon. In embodiments, a temperature model may be used to generate voice coil temperature prediction. That is, a voice coil temperature estimation/prediction 'T' may be based on resistivity variation with temperature:

$$R = R_{ref}(1 + \alpha(T - T_{ref})),$$ (Eq. 3)

where solving for T yields:

$$T = T_{ref} + \frac{1}{\alpha}\left(\frac{R}{R_{ref}} - 1\right),$$ (Eq. 4)

where $T_{ref}$ is a reference temperature of the loudspeaker and may be assumed as ambient temperature for the voice coil in embodiments, $R_{ref}$ is a reference resistivity of the loudspeaker at $T_{ref}$, R is the estimated resistivity of the impedance model, and $\alpha$ is the temperature coefficient of the material of the voice coil.

Different materials may be used in voice coils such as voice coil 128 of FIG. 1C. For copper, the temperature coefficient $\alpha$ is 0.0039 $C^{-1}$, and for aluminum the temperature coefficient $\alpha$ is 0.0043 $C^{-1}$. As noted above, the electrical resistivity is estimated as part of the impedance model fitting performed by impedance model fitter 202, and the temperature coefficient is determined based on the material of the voice coil. A corresponding pair of the resistivity of the voice coil at a specific temperature, i.e., $R_{ref}$ and $T_{ref}$, respectively, can be determined in a multitude of ways, according to embodiments. A pair may be established based on the type of microspeaker and the assumed constant, or an assembly line calibration can be carried out for every loudspeaker device during manufacture thereof.

Additionally, a form of tracking may be carried out, e.g., including estimating the temperature coefficient $\alpha$. To establish a corresponding pair of $R_{ref}$ and $T_{ref}$, a temperature measurement is required. Measuring the temperature of the voice coil may not be practical in some cases, but the temperature of the immediate surrounding air is possible, and if the environment is stationary and has reached equilibrium, then the voice coil temperature can be assumed to be substantially equal to the immediate surrounding air. At the same time, because the electrical resistivity $R_{ref}$ needs to be estimated, meaningful current- and voltage-sense signals must be present, yet the power cannot introduce any notable heating of the voice coil to prevent the voice coil temperature from being higher than the immediate surrounding air. Hence, the audio signal voltage amplitude needs to satisfy a set of requirements for such a tracking method of $R_{ref}$ and $T_{ref}$.

First, the audio signal must be of sufficiently large amplitude to allow reliable estimation of the electrical resistivity, i.e., current- and voltage-sense signals must be above their respective noise floors with a given margin. Next, the audio signal must be of sufficiently small amplitude to prevent notable heating of the voice coil above the temperature of the immediate surrounding air. Additionally, the environment must be stationary and at equilibrium, i.e., the above requirements are met for a given amount of time to ensure that voice coil temperature is stable at the immediate surrounding air, and that the resistivity estimated from the impedance model accurately reflects the voice coil resistivity.

By collecting a set of corresponding pairs of electrical resistivity and voice coil temperature according to the above described technique, it is also possible to estimate the temperature coefficient $\alpha$, e.g. by linear regression, given that an available temperature range is not overly limited (in which case the uncertainty, or the error on the estimate of the temperature coefficient, may become disadvantageously large).

In modeling and predicting voice coil temperature, the described embodiments and techniques provide for limiting the estimation error of the predicted voice coil temperature. For instance, measurements and/or prediction error on sensed voltage and current signals will affect the estimated model parameters, and ultimately the predicted/modeled excursion and voice coil temperature, and thereby affect the effectiveness of the loudspeaker protection. Accordingly, extra "headroom" can be added to excursion and temperature limits at the cost of reduced loudness, and therefore in embodiments, it may be desirable to limit any such extra headroom.

The voice coil temperature T is estimated from the present estimate of the resistivity R of the voice coil as the resistivity R of the voice coil material changes with temperature according to its temperature coefficient $\alpha$ (see Eq. 4 above). If the estimate of the voice coil resistivity R, for the purpose of this example, is simplified as the ratio between the voice coil voltage U and voice coil current I (which is approximately true at certain audio signal frequencies), and the voice coil voltage U and current I are associated with a relative error $\delta_U$ and $\delta_I$ with respect to a true voltage $U_{true}$ and a true current $I_{true}$:

$$U = (1 \pm \delta_U)U_{true},$$ (Eq. 5)

$$I = (1 \pm \delta_I)I_{true},$$ (Eq. 6)

and then the temperature T can be expressed as:

$$T(\delta_U, \delta_I) = T_{ref} + \frac{1}{\alpha}\left(\frac{U/I}{R_{ref}} - 1\right) = T_{ref} + \frac{1}{\alpha}\left(\frac{1 \pm \delta_U}{1 \pm \delta_I}\frac{R_{true}}{R_{ref}} - 1\right),$$ (Eq. 7)

and the resulting error ΔT on the temperature estimate is:

$$\Delta T = T_{true} - T(\delta_U, \delta_I) = \frac{1}{\alpha_{Cu}}\left(\frac{R_{true}}{R_{ref}} - 1\right) - \frac{1}{\alpha_{Cu}}\left(\frac{1 \pm \delta_U}{1 \pm \delta_I} \frac{R_{true}}{R_{ref}} - 1\right) \quad \text{(Eq. 8)}$$

$$= \frac{1}{\alpha_{Cu}}\left(\frac{R_{true}}{R_{ref}}\right)\left(1 - \frac{1 \pm \delta_U}{1 \pm \delta_I}\right) = \frac{1}{\alpha_{Cu}}\left(\frac{R_{true}}{R_{ref}}\right)\left(\frac{\pm \delta_I \mp \delta_U}{1 \pm \delta_I}\right).$$

If the relative error on the voltage and current signals are at their maximum, in opposite directions, and the measured current signal is at its minimum, then the error on the estimated voice coil temperature is at its largest. Assuming the relative error on the two sense signals is the same, i.e., $\delta_U = \delta_I$, then the maximum error on the estimated voice coil temperature is:

$$\Delta T_{max}(\delta) = -\frac{1}{\alpha}\left(\frac{R_{true}}{R_{ref}}\right)\left(\frac{2\delta}{1-\delta}\right). \quad \text{(Eq. 9)}$$

As an example, assuming a copper voice coil having an impedance $R_{ref}$ that has increased by 25% due to the temperature T (corresponding to a temperature increase of ~64° C.), if the maximum relative error on the sense signals is 5%, then the largest error on the estimated voice coil temperature $\Delta T_{max}$ is −34° C. In another example, a 1% error on the sense signals would result in $\Delta T_{max}$ is −6.5° C. In other words, the absolute maximum error $\Delta T_{max}$ on the estimated voice coil temperature can be expressed as:

$$|\Delta T_{max}(\delta)| = (\alpha^{-1} + T_{true} - T_{ref})\left(\frac{2\delta}{1-\delta}\right). \quad \text{(Eq. 10)}$$

Continuing with the example above, if a maximum error $\Delta T_{max}$ in the estimated voice coil temperature T of 10° C. is required, then the relative error on the measured voice coil current I and the measured/predicted voice coil voltage U should be below approximately 1% assuming that the error on the measured/predicted voice coil current I and voltage U are independent. However, it is contemplated that in embodiments, a sensing circuit for sensing U and I can be constructed such that it may provide sensed voltage U and sensed current I with relative errors that are correlated. In such a case, the errors may cancel each other out to some degree.

Temperature predictor 206 is configured to provide the temperature prediction to gain estimator 208 via a connector 220.

A gain change parameter is generated based on at least the temperature prediction (404). For example, gain estimator 208 is configured to receive the predicted voice coil temperature modeled in (402). Based on estimated/predicted temperature T from Eq. 4, and a specified $T_{max}$ of the voice coil (i.e., a maximum temperature above which continuous operation is not desired, as described herein), gain estimator 208 is configured to perform a heuristic method to calculate a full-band attenuation, $Gain_T$, of the audio signal, i.e., a gain change parameter. The gain change parameter may be an actual gain value, e.g., 0.8 when normal operational gain is 1.0, or may be a gain delta, e.g., 0.2 to achieve an effective gain of 0.8, according to embodiments. In such cases, the gain change parameter lowers the overall effective power of the audio signal, thus reducing the temperature of the voice coil. The gain change parameter may be 1.0, or a gain delta of 0.0, when it is not desired to lower the voice coil temperature, as described in further detail herein. In embodiments, a faster rate of increase for temperature T may result in the generation of a gain change parameter that reduces the overall effective gain more than a relatively slower rate of increase for temperature T.

The gain change parameter is provided to a temperature-constraining processing component (406). For instance, gain estimator 208 may provide the gain change parameter to temperature-constraining processing circuitry, e.g., of downstream audio signal processing component 102 of FIG. 1A, via a connector 222, as described in further detail herein.

Figure 5:
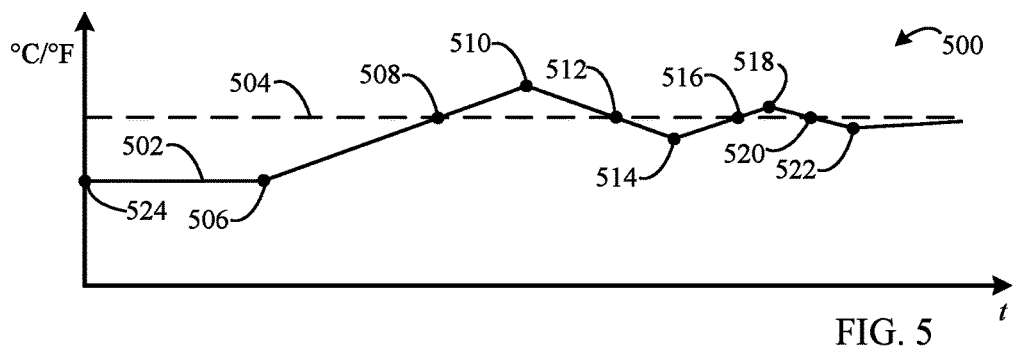
FIG. 5 shows a graph of temperature prediction and gain change, according to an example embodiment.

FIG. 5 shows a graph 500 of temperature prediction and gain change, according to an embodiment. The estimated temperature of an example voice coil of a loudspeaker when operating, as described herein, is described with respect to graph 500. In graph 500, a temperature 502 that is estimated for the voice coil while operating in degrees (y-axis) is plotted with respect to time 't' (x-axis). Graph 500 includes a threshold 504. In embodiments, temperature 502 may be predicted/modeled (or tracked) by temperature predictor 206 of FIG. 2 for any time 't' in graph 500.

Threshold 504 is a temperature threshold above which it is not desired to continuously operate a voice coil of a given loudspeaker, e.g., due to the risk of melting the adhesive that holds the voice coil in place in the loudspeaker. Threshold 504 may be set according to loudspeaker manufacturer specifications, and in embodiments may include an error tolerance as described above with respect to Eqs. 7-10. That is, given a maximum desired continuous operational temperature of a voice coil, threshold 504 may be set at a value less than or equal to the maximum desired operational temperature minus $\Delta T_{max}$.

As a non-limiting, illustrative example, temperature 502 of graph 500 begins at time "zero," or a point t(524), and remains approximately constant until a point t(506) at which time the operation of the loudspeaker results in an increase in temperature 502 of the voice coil. Operation continues as temperature 502 approaches a point t(508), i.e., an upward crossing of threshold 504. At or near this crossing, a gain change parameter may be generated and provided according to the method above as described in (404) and (406) of flowchart 400. That is, from point t(524) to at or near point t(508), temperature 502 is modeled/predicted by temperature predictor 206, and the overall effective gain applied to the audio signal is 1.0, or a delta gain of 0.0, because temperature 502 is below threshold 504, according to embodiments. When temperature 502 reaches or upwardly approaches threshold 504, i.e., t(508), as modeled/predicted by temperature predictor 206, gain estimator 208 is configured to receive estimated temperature 502 and generate a gain change parameter based on temperature 502 such that the effective gain applied to the audio signal to be played back is less than 1.0, as described above, and the gain change parameter is provided to temperature-constraining processing circuitry.

With the application of the gain change parameter (i.e., with a gain less than 1.0) to the processing of the audio signal, the increase of temperature 502 as shown approaching point t(508) begins to slow and eventually temperature 502 ceases to increase and begins to decrease as shown at a point t(510). Temperature 502 continues to decrease and downwardly approach threshold 504 at a point t(512), i.e., approach a downward crossing of threshold 504. At, after, or near reaching point t(512), the temperature constraint resulting from the application of the gain change parameter described above may be removed by gain estimator 208.

That is, the gain change parameter may no longer be applied, and the effective overall gain may return to 1.0. The decrease of temperature 502 after point t(512), with the overall effective gain again at 1.0, begins to slow and eventually temperature 502 begins to increase at a point t(514). In embodiments, temperature 502 at point t(514) may be higher than temperature 502 at point t(506) as temperature 502 approaches a steady state, or approximate steady state, at or near threshold 504.

Operation continues as temperature 502 approaches a point t(516), i.e., another upward crossing of threshold 504. At or near this crossing, a gain change parameter may be generated and provided by gain estimator 208 according to the method above as described in (404) and (406) of flowchart 400 to reduce the effective gain applied to the audio signal. The gain change parameter generated that is associated with point t(516) may be the same as or may be different than the gain change parameter above that is associated with point t(508). For instance, if the rate of increase of temperature 502 as it upwardly approaches threshold 504 at or near point t(516) is less than that on approach of threshold 504 at point t(508), the current gain change parameter may provide less of a temperature constraint for the audio signal than at point t(508) (i.e., the effective gain at point t(516) may be higher than at point 4508)). With the application of the gain change parameter at or near point t(516) (i.e., with a gain less than 1.0) to the processing of the audio signal, the increase of temperature 502 as shown approaching point t(516) begins to slow and eventually temperature 502 ceases to increase and begins to decrease as shown at a point t(518). Temperature 502 continues to decrease and downwardly approach threshold 504 at a point t(520), i.e., approach another downward crossing of threshold 504. Again, according to embodiments, temperature 502 at point t(518) may be lower than temperature 502 at point t(510) as temperature 502 approaches a steady state, or approximate steady state, at or near threshold 504.

At, after, or near reaching point t(520), the temperature constraint resulting from the application of the gain change parameter described above at point t(516) may be removed by gain estimator 208. That is, the gain change parameter may no longer be applied, and the effective overall gain may return to 1.0. The decrease of temperature 502 after point t(520), with the overall effective gain again at 1.0, begins to slow and eventually temperature 502 begins to increase at a point t(522). In embodiments, temperature 502 at point t(522) may be higher than temperature 502 at point t(506) and point t(514) as temperature 502 approaches a steady state, or approximate steady state, at or near threshold 504.

Additionally, unlike over-excursion conditions breaking the suspension of a loudspeaker, over-heating conditions melting the adhesives to voice coils are a relatively slower process, and therefore the application of temperature limiting techniques described herein may lag the application excursion limiting techniques. Accordingly, in initial operation of a loudspeaker, the application excursion limiting techniques may initially result in temperature limiting to some degree. The temperature limiting techniques may apply gain changes that are very small (and hence result in a relatively slow change of the gain) in order to avoid objectionable modulation of the audio, and instead leave the user with just a sense of a (relatively slow) change in volume instead of an objectionable distortion.

Figure 6:
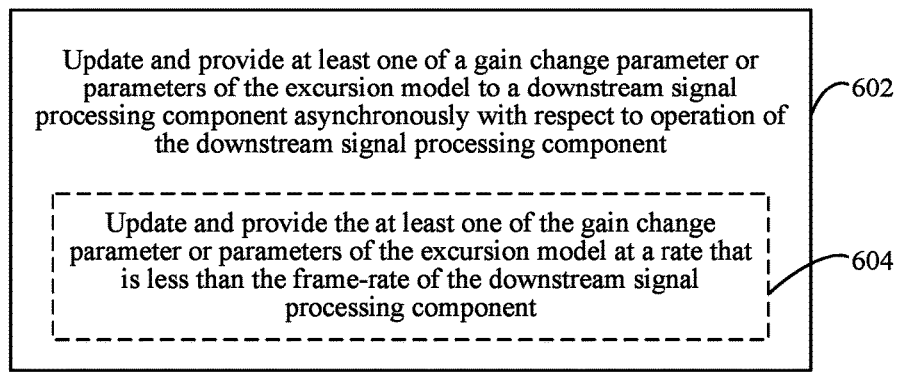
FIG. 6 shows a flowchart for providing model and temperature prediction updates by the upstream loudspeaker model estimation component of FIG. 2, according to an example embodiment.

Turning now to FIG. 6, a flowchart 600 for providing model and temperature prediction updates by upstream loudspeaker model estimation component 200 of FIG. 2 is shown, according to an embodiment. Upstream loudspeaker model estimation component 200, along with its subcomponents such as impedance to excursion model converter 204, temperature predictor 206, and gain estimator 208, may be configured to perform their respective functions in accordance with flowchart 600. Flowchart 600 is described as follows.

At least one of a gain change parameter or an excursion model is updated and provided to a downstream audio signal processing component asynchronously with respect to operation of the downstream audio signal processing component (602). For example, impedance to excursion model converter 204 and gain estimator 208 of upstream loudspeaker model estimation component 200 may be configured respectively update an excursion model and a gain change parameter, as described herein, and such updates may be performed asynchronously with respect to a downstream processing component, e.g., downstream audio signal processing component 102 of FIG. 1A, or its subcomponents as described further herein. Additionally, impedance to excursion model converter 204 and gain estimator 208 of upstream loudspeaker model estimation component 200 may be configured respectively to provide the excursion model and the gain change parameter to the downstream processing component, or its subcomponents, as described herein, and such provision may be performed asynchronously with respect to the downstream processing component, or its subcomponents, as described further herein. That is, any subcomponents of upstream loudspeaker model estimation component 200 may be configured to perform their respective functions in an asynchronous manner with respect to the downstream processing component.

In embodiments, flowchart 600 may also include an optional operation. At least one of the temperature prediction or the excursion model is updated and provided at a rate that is less than the frame-rate of the downstream audio signal processing component (604). For example, impedance to excursion model converter 204 and gain estimator 208 of upstream loudspeaker model estimation component 200 may be configured respectively to update an excursion model and a gain change parameter, as described herein, and such updates may be performed at a rate that is less than the frame-rate of the downstream audio signal processing component, e.g., downstream audio signal processing component 102 of FIG. 1A, or its subcomponents as described further herein. In embodiments, a frame-rate of upstream loudspeaker model estimation components and/or subcomponents may refer to how often an excursion model and/or gain change parameter are updated/provided, and a frame-rate of downstream audio signal processing components and/or subcomponents may refer to how often a frame of an audio signal is provided as an output. Additionally, impedance to excursion model converter 204 and gain estimator 208 of upstream loudspeaker model estimation component 200 may be configured respectively to provide the excursion model and the gain change parameter to the downstream processing component, or its subcomponents, as described herein, and such provisions may be performed at a rate that is less than the frame-rate of the downstream audio signal processing component, or its subcomponents, as described further herein. That is, any subcomponents of upstream loudspeaker model estimation component 200 may be configured to perform their respective functions at frame rates that are less than, equal to, or greater than those of the downstream processing component.

III. Example Downstream Processing Embodiments

As noted above, systems for protection of loudspeakers, such as microspeakers, along with their components such as downstream processing components, may be configured in various ways to provide loudspeaker protection.

In embodiments, by way of illustrative example and not limitation, a downstream audio signal processing component comprises one or more subcomponents configured to constrain the temperature of a loudspeaker (or voice coil thereof) during operation, constrain an excursion of the loudspeaker, and suppress distortion of an audio signal to be played back by the loudspeaker. These functions of the downstream audio signal processing component may be based, at least in part, on temperature estimations/predictions, gain change parameters, and excursion models, of the loudspeaker during its operation, as described in the preceding Section.

Figure 7:
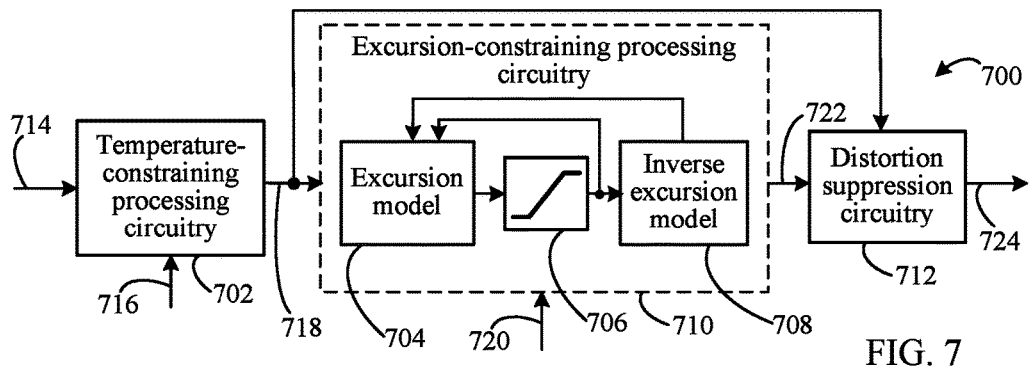
FIG. 7 shows a block diagram of a downstream audio signal processing component of a loudspeaker protection system, according to an example embodiment.

FIG. 7 shows a block diagram of a downstream audio signal processing component 700 of a loudspeaker protection system, according to an embodiment. Downstream audio signal processing component 700 may be a further embodiment of downstream audio signal processing component 102 of FIG. 1A. Downstream audio signal processing component 700 includes a temperature-constraining processing circuitry 702, excursion model circuitry 704, a limiter 706, inverse excursion model circuitry 708, and distortion suppression circuitry 712. In embodiments, excursion model circuitry 704, limiter 706, inverse excursion model circuitry 708 may together comprise excursion-constraining processing circuitry 710.

Figure 8:
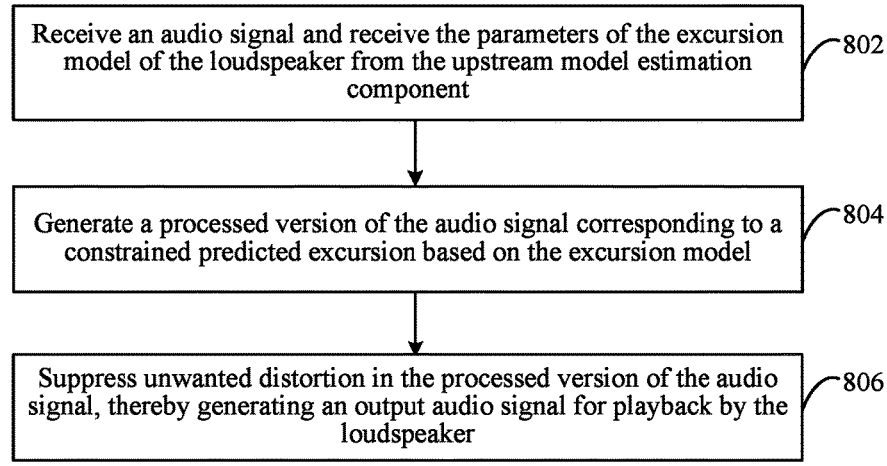
FIG. 8 shows a flowchart for constraining excursions and suppressing distortion by the downstream audio signal processing component of FIG. 7, according to an example embodiment.

Referring also to FIG. 8, a flowchart 800 for constraining excursions and suppressing distortion by downstream audio signal processing component 700 of FIG. 7 is shown, according to an embodiment. Downstream audio signal processing component 700, along with its subcomponents such as excursion model circuitry 704, limiter 706, inverse excursion model circuitry 708, and distortion suppression circuitry 712, may be configured to perform their respective functions in accordance with flowchart 800. Flowchart 800 is described as follows.

The audio signal is received and the parameters of the excursion model of the loudspeaker are received from the upstream loudspeaker model estimation component (802). For instance, excursion-constraining processing circuitry 710 is configured to receive the excursion model parameters, e.g., at excursion model circuitry 704, from upstream loudspeaker model estimation component 200, e.g., from impedance to excursion model converter 204, via a connector 720. In embodiments, parameters of the excursion model may be provided to and received by excursion-constraining processing circuitry 710.

A processed version of the audio signal corresponding to a constrained predicted excursion is generated based on the excursion model (804). For example, excursion-constraining processing circuitry 710 is configured to limit an excursion of the diaphragm in a loudspeaker. In embodiments, excursion-constraining processing circuitry 710 is configured to limit an excursion of a loudspeaker, such as loudspeaker 106 of FIG. 1A, according to the excursion model generated/converted in (306) of FIG. 3 and received via a connector 720. Excursion-constraining processing circuitry 710 is configured to constrain a predicted excursion of a loudspeaker according to parameters of the excursion model generated/converted in (306) received via connector 720, according to embodiments. That is, according to embodiments, the excursion model or parameters thereof may be provided to feed-forward excursion model circuitry 704 with integral feed-backward inverse excursion model circuitry 708 and limiter 706, together comprising a non-linear constraint filter, to limit an excursion of a loudspeaker by generating a processed version of the audio signal having a voltage corresponding to a limited excursion.

Distortion suppression circuitry 712 is configured to suppress unwanted distortion in the processed version of the audio signal. Distortion in the processed version of the audio signal is suppressed, thereby generating an output audio signal for playback by the loudspeaker (806). For instance, distortion suppression circuitry 712 may receive the processed version of the audio signal (as in 804) from excursion-constraining processing circuitry 710, via a connector 722, and suppress distortion in the processed version of the audio signal. Distortion suppression circuitry 712 may also be configured to receive a temperature-constrained audio signal from temperature-constraining processing circuitry 702 via a connector 718, as described below, for use in the distortion suppression. In some cases, the processed version of the audio signal may have distortion present due to the processing of the excursion-constraining processing circuitry 710 to constrain an excursion of a loudspeaker. Distortion suppression circuitry 712 is configured to suppress this distortion in the processed version of the audio signal based at least on energy, in embodiments with frequency resolution such as power or magnitude spectra, of the processed version of the audio signal. Accordingly, distortion suppression circuitry 712 is configured to generate an output audio signal for playback by the loudspeaker having suppressed distortion. The output audio signal may be provided for playback by the loudspeaker via a connector 724.

Figure 9:
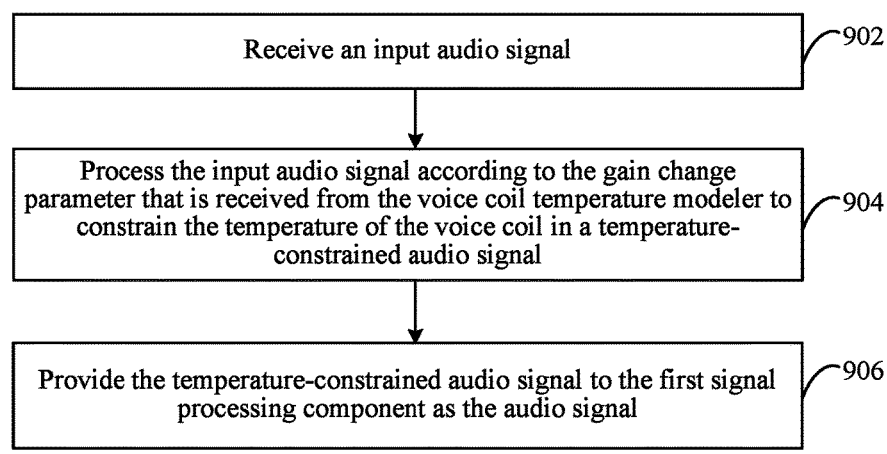
FIG. 9 shows a flowchart for constraining temperature by the downstream audio signal processing component of FIG. 7, according to an example embodiment.

FIG. 9 shows a flowchart 900 for constraining temperature by downstream audio signal processing component 700 of FIG. 7, according to an embodiment. Downstream audio signal processing component 700, along with its subcomponents such as temperature-constraining processing circuitry 702, may be configured to perform their respective functions in accordance with flowchart 900. Flowchart 900 is described as follows.

An input audio signal is received (902). For example, temperature-constraining processing circuitry 702 is configured to receive an input audio signal via a connector 714. The input audio signal may be provided by a microphone, a processor, or a memory of a device, as described herein. In embodiments, the audio signal is received as a digital audio signal, although receiving analog audio signals is contemplated herein.

The input audio signal is processed according to the gain change parameter that is received from the voice coil temperature modeler to constrain the temperature of the voice coil in a temperature-constrained audio signal (904). For instance, temperature-constraining processing circuitry 702 is configured to process an input audio signal that is received via connector 714 according to the gain change parameter provided by gain estimator 208 of upstream loudspeaker model estimation component 200 in (406) via connector 716 to reduce the temperature of a loudspeaker or a voice coil thereof. In embodiments, the gain change parameter is applied to the input audio signal to lower the overall effective gain when the temperature of a loudspeaker or voice coil exceeds a determined value or is increasing toward the determined value, as described herein. When the temperature is decreasing, the constraint of (904) may be relaxed, as described above, and temperature-constraining processing circuitry 702 may process the input audio signal on connector 714 using, e.g., a unity gain, or a gain that is higher than the gain change parameter used to constrain the input audio signal.

The temperature-constrained audio signal is provided to the first audio signal processing component as the audio signal (906). For example, temperature-constraining processing circuitry 702 is configured to provide the temperature-constrained audio signal of (904) to excursion-constraining processing circuitry 710 via connector 718. In embodiments, (906) may further include providing the temperature-constrained audio signal via connector 718 to distortion suppression circuitry 712, as described above in (806).

IV. Further Example Embodiments and Advantages

As noted above, systems and devices may be configured in various ways to perform methods for loudspeaker protection according to the techniques and embodiments provided. For instance, in embodiments, upstream loudspeaker model estimation components are configured to receive sensed electrical characteristics of a loudspeaker and generate an impedance model from which an excursion model of the loudspeaker and a gain change parameter may be generated. Downstream processing components may subsequently utilize the gain change parameter and the excursion model (or parameters thereof) to constrain the temperature of a voice coil of the loudspeaker and to limit an excursion of the loudspeaker. Downstream processing components may also utilize processed signals associated with the constrained temperature and the limited excursion to suppress distortion for an output audio signal to be played back by the loudspeaker.

According to the described techniques, the gain change parameter and the excursion model, along with its associated parameters, may be updated at any rate, and may be updated independently of audio processing circuitry (i.e., asynchronously). The audio processing circuitry is configured to process audio signals at a rate such that a processed audio frame is provided as output to be played back by a loudspeaker for every audio frame input received. For example, the downstream processing components described herein may process an audio frame approximately every 10 ms. However, while the downstream model estimation components may update the gain change parameter and the excursion model at a similar rate, in embodiments the updating for the gain change parameter and the excursion model may be performed at a slower rate that provides a balance between robust loudspeaker protection, power usage, and system complexity.

Additionally, because the downstream processing components process the audio signals and the upstream loudspeaker model estimation components do not process the audio signals, according to embodiments, the updating rate of the upstream loudspeaker model estimation components is not required to be as fast as the downstream processing components, e.g., for temperature prediction and gain change parameter generation based on a relatively slowly changing temperature for loudspeakers and voice coils in devices. It is contemplated in embodiments, however, that the conversion/generation and updating for excursion models may be performed at a rate that is higher than that for the temperature prediction and gain change parameter, but is less than or equal to the operating rate for processing audio signals by the downstream processing components.

The described embodiments may be configured to use properties of only the measured magnitude impedance (i.e., from the sensed voice coil current and voltage signals) to fit the individual components of the impedance model. This results in a robust, accurate, and low complexity method that is insensitive to the phase of the current and voltage sense signals. That is, such a method uses only the magnitude of the current and voltage magnitude spectra to estimate the magnitude spectrum of the impedance. Additionally, this method converges quickly and is not subject to typical convergence issues of adaptive filters. The disclosed embodiments and processing to constrain diaphragm or cone displacement (i.e., excursions) is effectively a unique non-linear filter, that is highly effective in combination with a distortion suppression method to constrain the diaphragm displacement, minimize distortion to the signal, and yet maintain good loudness of the played-back audio signal.

Furthermore, the techniques and embodiments herein cover more than just the basic properties of the physical system made up of the loudspeaker—rather the described techniques and embodiments are capable of modeling unique features of device loudspeakers, such as microspeakers, mounted in devices. For instance, device loudspeakers may produce an impedance with two resonances (e.g., a primary resonance and a secondary resonance). The present techniques and embodiments are capable of modeling both the primary and the secondary resonance of such loudspeakers.

In embodiments, one or more of the operations of any flowchart described herein may not be performed. Moreover, operations in addition to or in lieu of any flowchart described herein may be performed. Further, in embodiments, one or more operations of any flowchart described herein may be performed out of order, in an alternate sequence, or partially (or completely) concurrently with each other or with other operations.

A "connector," as used herein, may refer to a hardware connection or a software connection for the transfer of data, instructions, and/or information, according to embodiments.

The further example embodiments and advantages described in this Section may be applicable to embodiments disclosed in any other Section of this disclosure.

Embodiments and techniques, including methods, described herein may be performed in various ways such as, but not limited to, being implemented in hardware, or hardware combined with one or both of software and firmware. For example, embodiments may be implemented in systems and devices, as well as specifically customized hardware, ASICs, electrical circuitry, and/or the like.

V. Example Computer Implementations

Loudspeaker protection system 100A of FIG. 1A, device 100B of FIG. 1B, microspeaker 100C of FIG. 1C, upstream loudspeaker model estimation component 200 of FIG. 2, and/or downstream audio signal processing component 700 of FIG. 7, along with any respective components/subcomponents thereof, and/or any flowcharts, further systems, sub-systems, and/or components disclosed herein may be implemented in hardware (e.g., hardware logic/electrical circuitry), or any combination of hardware with one or both of software (computer program code or instructions configured to be executed in one or more processors or processing devices) and firmware.

Figure 10:
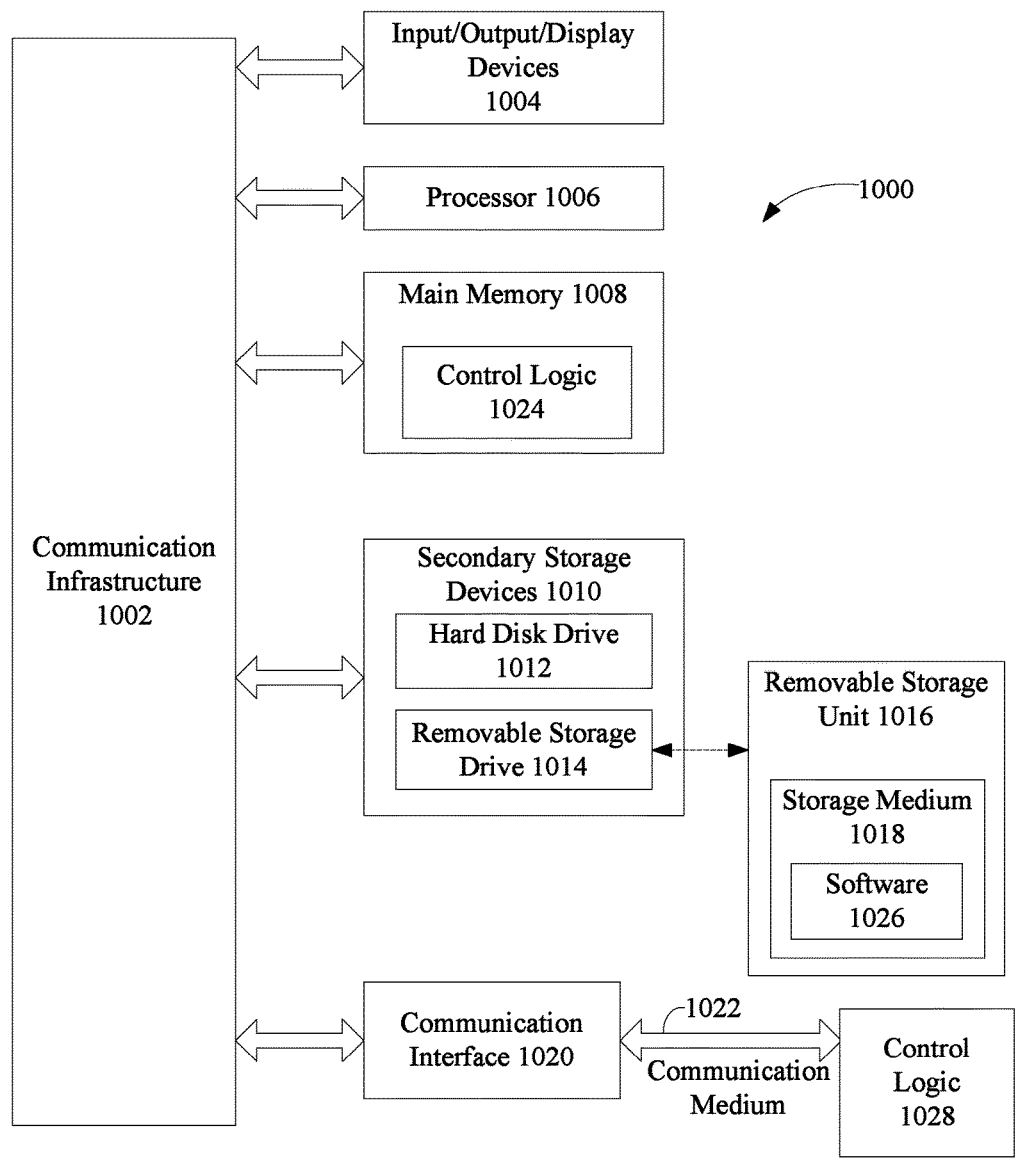
FIG. 10 shows a block diagram of a computing device/system in which the techniques disclosed herein may be performed and the example embodiments herein may be utilized.

The embodiments described herein, including circuitry, devices, systems, methods/processes, and/or apparatuses, may be implemented in or using well known processing devices, communication systems, servers, and/or computers, such as a processing device 1000 shown in FIG. 10. It should be noted that processing device 1000 may represent communication devices/systems (e.g., device 100B), entertainment systems/devices, processing devices, and/or traditional computers in one or more embodiments. For example, loudspeaker protection systems and devices, and any of the sub-systems and/or components respectively contained therein and/or associated therewith, may be implemented in or using one or more processing devices 1000 and similar computing devices.

Processing device 1000 can be any commercially available and well known communication device, processing device, and/or computer capable of performing the functions described herein, such as devices/computers available from International Business Machines®, Apple®, Sun®, HP®, Dell®, Cray®, Samsung®, Nokia®, etc. Processing device 1000 may be any type of computer, including a desktop computer, a server, etc., and may be a computing device or system within another device or system.

Processing device 1000 includes one or more processors (also called central processing units, or CPUs), such as a processor 1006. Processor 1006 is connected to a communication infrastructure 1002, such as a communication bus. In some embodiments, processor 1006 can simultaneously operate multiple computing threads, and in some embodiments, processor 1006 may comprise one or more processors.

Processing device 1000 also includes a primary or main memory 1008, such as random access memory (RAM). Main memory 1008 has stored therein control logic 1024 (computer software), and data.

Processing device 1000 also includes one or more secondary storage devices 1010. Secondary storage devices 1010 include, for example, a hard disk drive 1012 and/or a removable storage device or drive 1014, as well as other types of storage devices, such as memory cards and memory sticks. For instance, processing device 1000 may include an industry standard interface, such a universal serial bus (USB) interface for interfacing with devices such as a memory stick. Removable storage drive 1014 represents a floppy disk drive, a magnetic tape drive, a compact disk drive, an optical storage device, tape backup, etc.

Removable storage drive 1014 interacts with a removable storage unit 1016. Removable storage unit 1016 includes a computer useable or readable storage medium 1018 having stored therein computer software 1026 (control logic) and/or data. Removable storage unit 1016 represents a floppy disk, magnetic tape, compact disk, DVD, optical storage disk, or any other computer data storage device. Removable storage drive 1014 reads from and/or writes to removable storage unit 1016 in a well-known manner.

Processing device 1000 also includes input/output/display devices 1004, such as touchscreens, LED and LCD displays, monitors, keyboards, pointing devices, etc.

Processing device 1000 further includes a communication or network interface 1020. Communication interface 1020 enables processing device 1000 to communicate with remote devices. For example, communication interface 1020 allows processing device 1000 to communicate over communication networks or mediums 1022 (representing a form of a computer useable or readable medium), such as LANs, WANs, the Internet, etc. Network interface 1020 may interface with remote sites or networks via wired or wireless connections.

Control logic 1028 may be transmitted to and from processing device 1000 via the communication medium 1022.

Any apparatus or manufacture comprising a computer useable or readable medium having control logic (software) stored therein is referred to herein as a computer program product or program storage device. This includes, but is not limited to, processing device 1000, main memory 1008, secondary storage devices 1010, and removable storage unit 1016. Such computer program products, having control logic stored therein that, when executed by one or more data processing devices, cause such data processing devices to operate as described herein, represent embodiments.

Techniques, including methods, and embodiments described herein may be implemented by hardware (digital and/or analog) or a combination of hardware with one or both of software and/or firmware. Techniques described herein may be implemented by one or more components. Embodiments may comprise computer program products comprising logic (e.g., in the form of program code or software as well as firmware) stored on any computer useable medium, which may be integrated in or separate from other components. Such program code, when executed by one or more processor circuits, causes a device to operate as described herein. Devices in which embodiments may be implemented may include storage, such as storage drives, memory devices, and further types of physical hardware computer-readable storage media. Examples of such computer-readable storage media include, a hard disk, a removable magnetic disk, a removable optical disk, flash memory cards, digital video disks, random access memories (RAMs), read only memories (ROM), and other types of physical hardware storage media. In greater detail, examples of such computer-readable storage media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, flash memory cards, digital video discs, RAM devices, ROM devices, and further types of physical hardware storage media. Such computer-readable storage media may, for example, store computer program logic, e.g., program modules, comprising computer executable instructions that, when executed by one or more processor circuits, provide and/or maintain one or more aspects of functionality described herein with reference to the figures, as well as any and all components, capabilities, and functions therein and/or further embodiments described herein.

Such computer-readable storage media are distinguished from and non-overlapping with communication media and propagating signals (do not include communication media and propagating signals). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media and signals transmitted over wired media. Embodiments are also directed to such communication media.

The techniques and embodiments described herein may be implemented as, or in, various types of devices. For instance, embodiments may be included, without limitation, in processing devices (e.g., illustrated in FIG. 10) such as computers and servers, as well as communication systems such as switches, routers, gateways, and/or the like, communication devices such as smart phones, home electronics, gaming consoles, entertainment devices/systems, etc. A device, as defined herein, is a machine or manufacture as defined by 35 U.S.C. § 101. That is, as used herein, the term "device" refers to a machine or other tangible, manufactured object and excludes software and signals. Devices may include digital circuits, analog circuits, or a combination thereof. Devices may include one or more processor circuits (e.g., central processing units (CPUs), processor 1006 of FIG. 10), microprocessors, digital signal processors (DSPs), and further types of physical hardware processor circuits) and/or may be implemented with any semiconductor technology in a semiconductor material, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such devices may use the same or alternative configurations other than the configuration illustrated in embodiments presented herein.

VI. Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A loudspeaker protection system, comprising:
   an upstream loudspeaker model estimation component including:
      an impedance model fitter configured to receive at least current data of a loudspeaker during audio playback, to estimate an impedance of the loudspeaker based on the at least received current data, and to estimate a plurality of impedance model parameters of an impedance model of the loudspeaker based on the estimated impedance of the loudspeaker, and
      an excursion model converter configured to compare the estimated impedance model to the estimated impedance of the loudspeaker to estimate one or more first impedance model parameters of the plurality of impedance model parameters as being non-negligible and one or more second impedance model parameters of the plurality of impedance model parameters as being negligible, to convert the one or more first impedance model parameters to a plurality of parameters of an excursion model of the loudspeaker and to exclude the one or more second impedance model parameters from the excursion model of the loudspeaker; and
   a downstream audio signal processing component including:
      first audio signal processing circuitry configured to receive an audio signal and the plurality of parameters of the excursion model of the loudspeaker and to generate a processed version of the audio signal corresponding to a constrained predicted excursion based on the excursion model, and
      distortion suppression circuitry configured to suppress unwanted distortion in the processed version of the audio signal to generate an output audio signal for playback by the loudspeaker.

2. The loudspeaker protection system of claim 1, wherein the loudspeaker comprises a microspeaker, or wherein the loudspeaker speaker protection system comprises a portion of a mobile user device.

3. The loudspeaker protection system of claim 1, wherein the impedance model fitter is further configured to automatically adapt the excursion model to include the one or more second impedance model parameters if the one or more second impedance model parameters of the plurality of impedance model parameters are later estimated to be non-negligible.

4. The loudspeaker protection system of claim 1, wherein the upstream loudspeaker model estimation component comprises:
   a voice coil temperature modeler configured to:
      estimate a temperature of a voice coil of the loudspeaker based on a resistivity portion of the plurality of impedance model parameter to generate a temperature prediction of the voice coil, and
      generate a gain change parameter based on at least the temperature prediction; and
   wherein the downstream audio signal processing component comprises:
      second audio signal processing circuitry configured to:
         receive an input audio signal;
         process the input audio signal according to the gain change parameter to constrain the temperature of the voice coil in a temperature-constrained audio signal; and
         provide the temperature-constrained audio signal to the first audio signal processing circuitry as the audio signal.

5. The loudspeaker protection system of claim 4, wherein when the temperature prediction is less than a temperature threshold, the gain change parameter is at least '1' such that the temperature-constrained audio signal has the same gain as or a higher gain than the input audio signal, and
   wherein when the temperature prediction is greater than the temperature threshold, the gain change parameter is less than '1' such that the temperature-constrained audio signal has a lower gain than the input audio signal.

6. The loudspeaker protection system of claim 4, wherein the upstream loudspeaker model estimation component is further configured to update and to provide at least one of:
   the gain change parameter to the downstream audio signal processing component asynchronously with respect to operation of the downstream audio signal processing component; or
   the gain change parameter at a rate that is less than a frame-rate of the downstream audio signal processing component.

7. The loudspeaker protection system of claim 1, wherein the upstream loudspeaker model estimation component is further configured to update and to provide at least one of:
   the plurality of parameters of the excursion model to the downstream audio signal processing component asynchronously with respect to operation of the downstream audio signal processing component; or
   the plurality of parameters of the excursion model at a rate that is less than the frame-rate of the downstream audio signal processing component.

8. A method for operating a loudspeaker protection system within an electronic device, the method comprising:
   estimating, by the loudspeaker protection system, an impedance of a loudspeaker within the electronic device during operation of the loudspeaker;

estimating, by the electronic device, a plurality of impedance model parameters of an impedance model of the loudspeaker based on the estimated impedance of the loudspeaker;

comparing, by the electronic device, the estimated impedance model to the estimated impedance of the loudspeaker to estimate one or more first impedance model parameters of the plurality of impedance model parameters as being non-negligible and one or more second impedance model parameters of the plurality of impedance model parameters as being negligible;

generating, by the electronic device, a plurality of parameters of an excursion model of the loudspeaker, the one or more first impedance model parameters being included within the excursion model of the loudspeaker and the one or more second impedance model parameters being excluded from the excursion model of the loudspeaker;

processing, by the electronic device, an audio signal to generate a processed audio signal corresponding to a predicted excursion of the loudspeaker based on the excursion model;

suppressing, by the electronic device, unwanted distortion of the processed version of the audio signal to generate an output audio signal; and providing, by the electronic device, the output audio signal for playback by the loudspeaker.

9. The method of claim 8, wherein the loudspeaker comprises a microspeaker.

10. The method of claim 8, wherein the loudspeaker protection system comprises a portion of a mobile user device.

11. The method of claim 8, further comprising:
estimating a temperature of a voice coil of the loudspeaker based on a resistivity portion of the impedance model to generate a temperature prediction of the voice coil, and generating a gain change parameter based on at least the temperature prediction;

processing an input audio signal according to the gain change parameter to constrain the temperature of the voice coil in a temperature-constrained audio signal; and providing the temperature-constrained audio signal as the audio signal.

12. The method of claim 11, wherein when the temperature prediction is less than a temperature threshold, the gain change parameter is at least '1' such that the temperature-constrained audio signal has the same gain as or a higher gain than the input audio signal, and wherein when the temperature prediction is greater than the temperature threshold, the gain change parameter is less than '1' such that the temperature-constrained audio signal has a lower gain than the input audio signal.

13. The method of claim 8, further comprising:
updating at least one of the gain change parameter or the excursion model asynchronously with respect to the processing.

14. The method of claim 13, wherein the updating comprises:
updating the at least one of the gain change parameter or the excursion model at a rate that is less than a frame-rate of the processing.

15. A non-transitory computer readable storage device comprising a storage medium encoded with program instructions that, when executed by a computing device, cause the computing device to perform a method for loudspeaker protection, the method comprising:

receiving one or more sensed indicia of electrical characteristics of operational performance of a loudspeaker;

estimating an impedance of the loudspeaker within the electronic device based on the received one or more sensed indicia;

estimating a plurality of impedance model parameters of an impedance model of the loudspeaker based on the estimated impedance of the loudspeaker;

comparing the estimated impedance model to the estimated impedance of the loudspeaker to estimate one or more first impedance model parameters of the plurality of impedance model parameters as being non-negligible and one or more second impedance model parameters of the plurality of impedance model parameters as being negligible;

generating a plurality of parameters of an excursion model of the loudspeaker the one or more first impedance model parameters being included within the excursion model of the loudspeaker and the one or more second impedance model parameters being excluded from the excursion model of the loudspeaker; and processing an audio signal to generate a processed audio signal corresponding to a predicted excursion of the loudspeaker based on the excursion model.

16. The computer readable storage device of claim 15, wherein the loudspeaker comprises a microspeaker.

17. The computer readable storage device of claim 15, wherein the computing device comprises a mobile user device.

18. The computer readable storage device of claim 15, the method further comprising:
updating the excursion model at a rate that is less than a frame-rate of the processing.

* * * * *